United States Patent
Master

(10) Patent No.: US 6,229,207 B1
(45) Date of Patent: *May 8, 2001

(54) ORGANIC PIN GRID ARRAY FLIP CHIP CARRIER PACKAGE

(75) Inventor: Raj N. Master, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/482,095

(22) Filed: Jan. 13, 2000

(51) Int. Cl.[7] ....................................... H01L 23/48
(52) U.S. Cl. ................... 257/697; 257/690; 257/700; 257/702; 257/772; 257/781; 257/779
(58) Field of Search ................... 257/778, 779, 257/781, 772, 697–710

(56) References Cited

U.S. PATENT DOCUMENTS

| | | |
|---|---|---|
| 4,170,472 | 10/1979 | Olsen et al. . |
| 4,290,079 | 9/1981 | Carpenter et al. . |
| 4,824,009 | 4/1989 | Master et al. . |
| 5,102,829 | 4/1992 | Cohn . |
| 5,237,130 | 8/1993 | Kulesza et al. . |
| 5,288,944 * | 2/1994 | Bronson et al. ................... 174/52.4 |
| 5,303,862 | 4/1994 | Bross et al. . |
| 5,468,995 * | 11/1995 | Higgins, III .......................... 257/697 |
| 5,541,450 * | 7/1996 | Jones et al. .......................... 257/697 |
| 5,625,166 | 4/1997 | Natarajan . |
| 5,625,944 * | 5/1997 | Werther ................................. 29/843 |
| 5,640,047 | 6/1997 | Nakashima . |
| 5,641,990 * | 6/1997 | Chiu ..................................... 257/737 |
| 5,831,336 | 11/1998 | DiGiacomo . |
| 5,834,839 | 11/1998 | Mertol . |
| 5,847,929 | 12/1998 | Bernier et al. . |
| 5,868,304 | 2/1999 | Brofman et al. . |
| 5,907,187 * | 5/1999 | Koiwa et al. .......................... 257/737 |
| 5,938,862 | 8/1999 | Yeh et al. . |
| 5,959,348 | 9/1999 | Chang et al. . |

* cited by examiner

Primary Examiner—Tom Thomas
Assistant Examiner—Nitin Parekh

(57) ABSTRACT

An organic carrier member for mounting a semiconductor device is provided that has a plurality of pin leads joined to conductive pads on the carrier member by a solder fillet having a reflow temperature higher than the temperature necessary to attach the semiconductor device. Embodiments include a bismaleimide-triazine epoxy laminate carrier member having an array of pins joined to the carrier member by a solder fillet having a reflow temperature of no greater than 275° C.

17 Claims, 3 Drawing Sheets

ORGANIC PIN GRID ARRAY FLIP CHIP CARRIER PACKAGE

BACKGROUND OF THE INVENTION

1. Field of the Invention

The present invention relates to an organic carrier member for mounting a semiconductor device, and more particularly to an organic carrier member having pin leads mounted thereon.

2. Background Art

The escalating requirements for high density and performance associated with ultra-large scale integration technology creates significant challenges for the design and implementation of electrical connections between circuit components and external electrical circuitry.

Integrated circuit (IC) devices whether individual active devices, individual passive devices, multiple active devices within a single chip, or multiple passive and active devices within a single chip, require suitable input/output (I/O) connections between themselves and other circuit elements or structures. These devices are typically very small and fragile. Because of their size and fragility, they are commonly carried on substrates for support, i.e., carrier members.

Device miniaturization and the ever increasing density of semiconductor devices require an ever increasing number of I/O terminals, shorter connections and improvements in the electrical connections, heat dissipation and insulation characteristics of the carrier member. This problem is exacerbated in manufacturing semiconductor devices having a design rule of about 0.18 microns and under.

One technique that supports the increased device densities is the shift from peripheral wire bonding to area array chip interconnects. Area array chip interconnects use bumps or solder joints that directly couples the IC chip or die to the carrier member. This technique accommodates an increased number of I/O terminals and provides electrical signals immediately below the chip, improving voltage noise margins and signal speed. One type of area array interconnect packaging technique is the flip chip (FC) solder interconnect on a carrier member.

In the flip chip assembly or package, the IC die and other devices are "bumped" with solder bumps or balls, i.e. a plurality of discrete solder bumps are formed over metal contacts on the surface of the die. The chip is then turned upside down or "flipped" so that the device side or face of the IC die couples to the carrier member such as found in a ceramic or plastic carrier member having balls, pins or land grid arrays. The solder bumps of the device are then attached to the carrier member forming an electrical and mechanical connection.

The carrier member conventionally employs a multi-layer substrate constructed of a plurality of laminated dielectric and conductive layers where individual IC chips are mounted to the top layer of the substrate. A pre-defined metallization pattern lies on each dielectric layer within the substrate. Metallization patterns on certain layers act as voltage reference planes and also provide power to the individual chips. Metallization patterns on other layers route signals between individual chips. Electrical connections to individual terminals of each chip and/or between separate layers are made through well-known vertical interconnects called "vias". Interconnect pins are bonded to metallic pads situated on the face of the substrate and are thereby connected to appropriate metallization patterns existing within the substrate. These interconnect pins route electrical signals between a multi-chip integrated circuit package and external devices.

As illustrated in FIG. 1, a conventional flip chip assembly 8 includes a device or IC die 10 mechanically and electrically attached to substrate 16 by a plurality of solder bumps 12 connected to solder pads 14 on substrate 16. Solder pads 14 are electrically connected to I/O pin leads 18 by internal wiring (not shown for illustrative convenience) throughout substrate 16. Pin leads 18 are used to provide the electrical connections to external circuitry. The assembly, thus, provides an electrical signal path from IC die 10 through solder/pad connections 12/14 through substrate 16, by way of internal wiring, to an external circuitry by way of pin leads 18.

As shown, substrate 16 has a plurality of solder pads 14, which are generally formed by screen printing a coating of solder on the substrate. Solder bumps 12 on die 10 are generally formed by known solder bumping techniques and are conventionally formed of a high lead (Pb) solder, such as solders having from 97–95 wt % Pb and from 3–5 wt % of tin (Sn), which have a melting temperature of approximately 323° C. Substrate 16 can be made of ceramic or plastic materials. When the substrate is made of a ceramic, the electrical and mechanical interconnect between the die and substrate is conventionally achieved by reflowing the solder pads 14 and solder bumps 12 at a relatively high temperature, such as 350° C. to 370° C., to join solder bumps 12 and pads 14 between the die and substrate 16. It is preferable to have the high melting interconnection on the die to avoid degradation of the die/substrate interconnection in subsequent thermal processing steps.

A known technique of mounting pin leads to a substrate involves coating metallized pads that serves as landing sites for the pins with an appropriate brazing or soldering alloy. The pins are then positioned over the coated metallized pads and the solder reflowed to join the pins to the pads.

One problem associated with attaching pin leads to metallized pads on a plastic or organic substrate is that the soldering temperature cannot be higher than the decomposition temperature of the substrate, without adversely compromising the mechanical integrity of the organic substrate. Further, the solders employed for joining pin leads to the substrate should form strong mechanical bonds capable of withstanding pulling, placement, or testing, i.e. socketing, the assembled carrier with good electrical signal. As the need for I/O leads increases and the need for lighter and smaller packages increase, the problems associated with packaging IC dies and capacitors creates new challenges.

Accordingly, a continuing need exists in the art for improved pin grid array packages permitting a strong, reliable, minimally resistive brazed joint formed between pin leads and metallized pads on an organic substrate.

SUMMARY OF THE INVENTION

An advantage of the present invention is an organic carrier member suitable for mounting a device with highly reliable pin leads.

Another advantage of the present invention is a device assembly that maintains reliable electrical connections during its operation.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a carrier member for mounting a device, such as an integrated circuit die, capacitor, etc. The carrier member comprises: an organic substrate having a plurality of conductive contacts thereon for receiving a device to be mounted thereto; a plurality of pads on the organic substrate which are in electrical communication with the conductive contacts on the organic substrate; and a plurality of pins mechanically and electrically joined to the pads by a solder fillet.

Advantageously, the solder fillet, joining the pads and pin leads, comprises a low weight percent (wt %) of tin and has a reflow temperature of less than about the decomposition temperature of the organic substrate and provides a high bond strength.

The organic substrate can comprise polyphenylene sulphide, polysulphone, polyethersulphone, polyarysulphone, phenol, polyamide, bismaleimide-triazine, epoxy or mixtures thereof with optionally fiberous materials, such as glass fibers, to fabricate a laminated structure with internal wiring connecting the solder pads with the leads at the bottom of the organic substrate. Alternatively, the organic substrate can be fabricated by any of the above resins, or mixtures thereof to form a non-laminated structure, such as a molded plastic part with internal wiring.

The solder fillets of the present invention advantageously reflow at a temperature less than about the decomposition temperature of the organic substrate. In an embodiment of the present invention, the solder fillet of the present invention has a reflow temperature of no greater than about 300° C., e.g. no greater than about 270° C.

Another aspect of the present invention is a device assembly comprising a device and a supporting organic carrier member. The device of the present invention can be an integrated circuit die having a plurality solder bumps, such as a bumped IC die or bumped capacitor, mounted to the supporting carrier member. In accordance with the present invention, the assembly comprises a device having a plurality of solderable contacts thereon, wherein the solderable contacts of the device are in electrical communication with the carrier member through the conductive contacts on the organic substrate.

Another aspect of the present invention is a method of manufacturing a device assembly. The method comprises providing a carrier member for mounting a device, wherein the carrier member comprises an organic substrate having a plurality of conductive contacts thereon for receiving a device to be mounted thereto; a plurality of pads on the organic substrate which are in electrical communication with the conductive contacts on the organic substrate; and a plurality of pins mechanically and electrically joined to the pads by a solder fillet, wherein the solder fillet has no more than about 60 wt % tin and has a reflow temperature of no greater than about the degradation temperature of the organic substrate; mounting a device having a plurality of solderable contacts thereon on to the carrier member such that the solderable contacts of the device are aligned with the conductive contacts on the organic substrate; and forming an electrical connection between the solderable contacts of the device and the conductive contacts on the organic substrate to form the device assembly.

The electrical connection between the device and substrate can advantageously be formed without substantially melting the solder fillet. The solder fillet, joining the conductive pads and pin leads of the present invention, has a higher reflow temperature than the temperature necessary to electrically connect the device to the substrate, but is below about the decomposition temperature of the substrate. In an embodiment of the invention, the conductive contacts comprise solder pads and forming the electrical connection between the solderable contacts of the device and the solder pads comprises reflowing the solder pads on the organic substrate by heating the carrier member from about 220° C. to about 270° C.

In an embodiment of the present invention, the difference between the reflow temperature of the solder pads on the organic substrate and the reflow temperature of the solder fillet joining the pins to the substrate is no less than about 10° C.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

The present invention stems from the discovery that employing solder fillets having a high reflow temperature and low tin content to mechanically and electrically bond a pin lead to a conductive pad on an organic substrate reduces or eliminates several problems associated with attaching pin leads to organic packages. In particular, it was discovered that solder fillets having a low tin content can be prepared that reflow below the decomposition temperature of the organic substrate yet strongly joins pin leads to conductive pads with little or no solder climbing up the pin shaft.

In order to address the difficulty of providing a highly reliable organic pin grid array carrier member, it was necessary to gain an understanding of the causes of the problems associated with attaching pin leads to the member. One problem that conventional, high tin solders encounter in bonding I/O pins to organic carrier members is that the conventional solders partially melt in subsequent thermal processing steps in forming a device assembly, such as attaching a die to the carrier member. Low temperature conventional solders, thus, permit the pins to move from their originally aligned positions when attaching the die to the member. Pin misalignment causes problems when test socketing, i.e., plugging the assembly into a testing apparatus.

It was further discovered upon investigation that certain solders have a propensity to migrate or climb along the pin shaft during the die attach process. It was found that, although some solders do not actually melt at the die attach processing temperature, conventional high tin containing solders have a propensity to climb up, or wet, the shafts of the pins thereby causing problems when socketing the assembly, particularly pins that are nickel- or gold-plated. Pins with solder on their shafts can interfere with fitting the carrier member into a socket and/or contaminate testing apparatus. The solder coated pin shafts further contaminate testing apparatus.

The present invention overcomes the undesirable pin movement by applying solder fillets on conductive pads on an organic carrier member that have a high reflow temperature. The solder fillets of the present invention further comprise solder alloys with a low tin content such that there is substantially little or no visible wetting of the pin shaft, yet the solder fillet of the present invention desirably provides a mechanically strong and electrically reliable joint between conductive pads on an organic carrier and pin leads.

Figure 1:
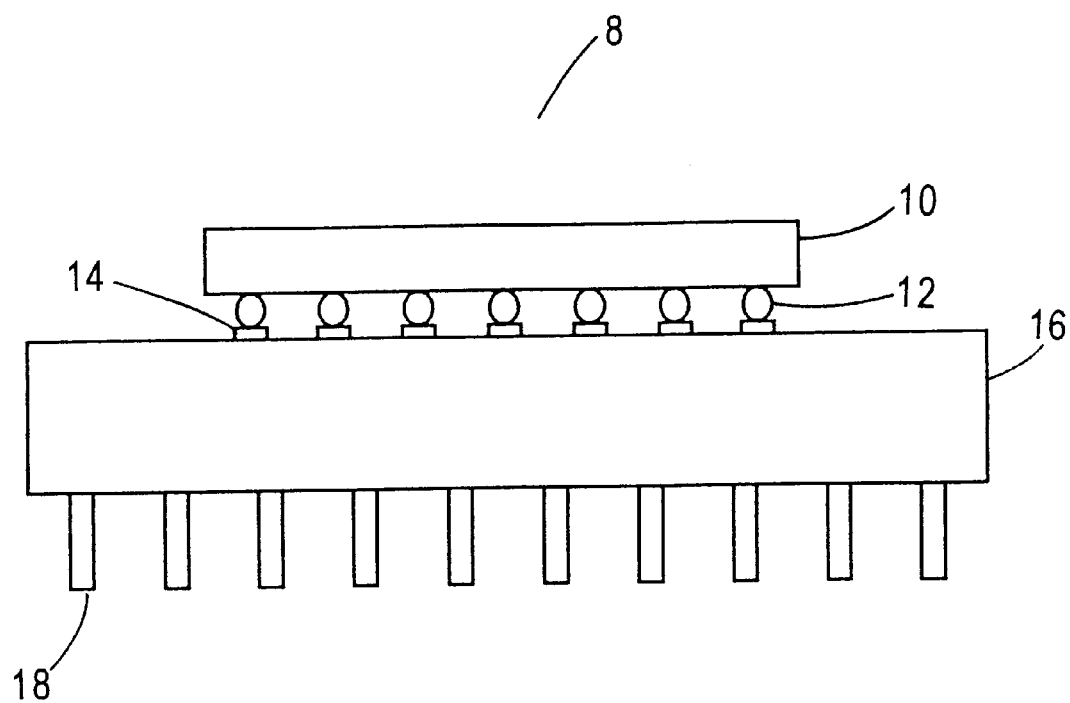
FIG. 1 schematically depicts a conventional flip chip assembly.
Figure 2:
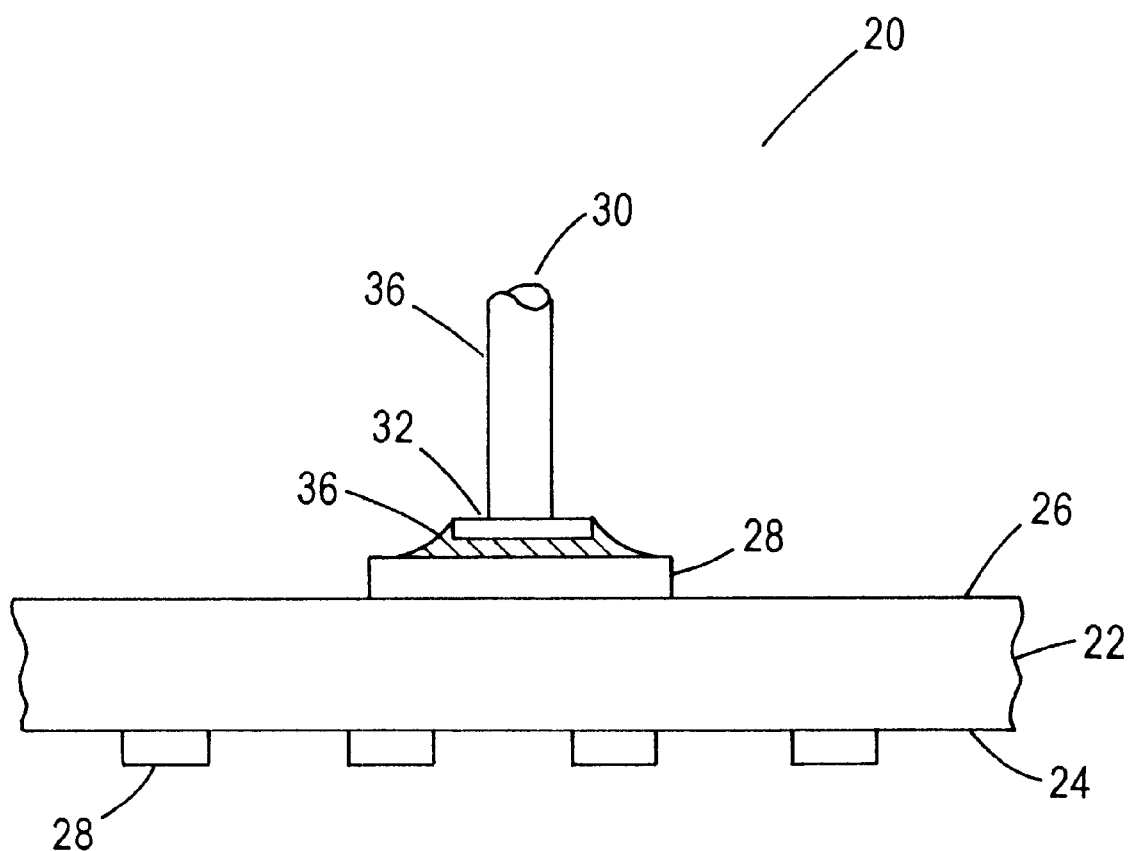
FIG. 2 schematically illustrates a cross-sectional view of a pin lead joined to a pad on an organic substrate of the present invention.

FIG. 2 illustrates an I/O connection of the present invention. I/O connection 20 comprises an organic substrate 22 having a top surface 24 and a bottom surface 26. Conductive pad 28 extends from bottom surface 26 of substrate 22 have pin lead 30 joined thereto. Pin lead 30 includes pin head 32 and pin shaft 34 and is joined to conductive pad 28 by solder fillet 36 bonding pin head 32 to conductive pad 28.

In an embodiment of the present invention, substrate 22 has an array of conductive pads 28 made of an electrically conductive, solder-wettable material, such as one or more layers of copper, nickel, gold, etc. at a total thickness of about 4–8 microns. A number of about 100 to about 3,000 of such conductive pads can be on the organic carrier substrate. The conductive pads can be on the same surface as the pin leads or on a different surface on the substrate. Pin head 32 and pin shaft 34 comprise a stiff conductive material, such as an alloy of Co—Ni—Fe and is coated with one or more layers of copper, nickel, and/or gold to improve wetability of solder bonding pad 28 and pin head 32. Solder fillet 36 of the present invention is applied to the conductive pad at a thickness of about 0.5 mm to about 1.5 mm or in an amount of about 1 gram per package and is reflowed at a temperature no greater than the decomposition temperature of the organic substrate to form a mechanically strong joint between the pin lead and the conductive pad with little or no solder on the shaft.

Figure 3:
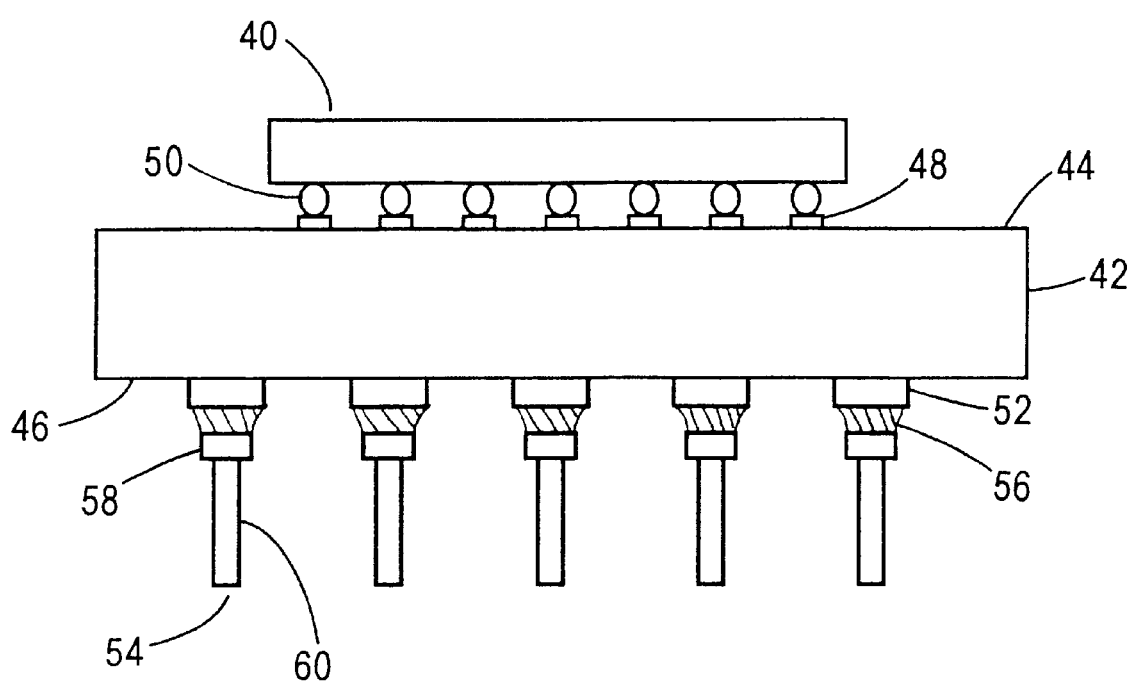
FIG. 3 depicts a cross-sectional view of a device assembly comprising a carrier member of the present invention.

FIG. 3 illustrates a device assembly comprising a semiconductor device 40 on a carrier member of the present invention having a plurality of I/O pin connections. As illustrated, the carrier member comprises an organic substrate 42 having a top surface 44 and a bottom surface 46. An array of conductive contacts, e.g. solder pads 48, are formed on the top surface 44 of organic substrate 42 for receiving device 40 having a plurality of solderable contacts 50. The array of solder pads 48 are patterned to correspond to solderable contacts 50 to be mounted thereto. A plurality of conductive pads 52 extend from the bottom surface 46 of organic substrate 42 are in electrical communication with solder pads 48 by an internal conductive structure, i.e. internal wiring (not shown for illustrative convenience). Leads 54 are mechanically and electrically joined to conductive pads 52 by solder fillets 56. Pins 54 comprise pin heads 58, joined to conductive pads 52 by solder fillets 56 and pin shafts 60.

In practicing the invention, solder alloy is deposited on conductive pads 52 by screen printing, electroplating, or the pins are preformed with the solder alloy. The pin leads are placed on top of the solder alloy, or in the case of presoldered pins, the pin heads having solder alloy of the present invention are positioned on conductive pads 52. The solder alloy is the heated to reflow such that the molten solder wets both pin heads 58 and conductive pads 52 without substantially wetting pin shafts 60, such that the pin shafts are substantially, if not completely free of solder, as shown in FIG. 3.

The solder alloy then cools forming solder fillets 56 which mechanically and electrically join pins 54 to pads 52. Given the guidance and objectives of the present disclosure, the optimum solder alloy compositions and organic substrate can be necessarily determined for particular carrier member and device assembly.

In accordance with the present invention, an organic substrate is provided having a plurality of pin leads joined to conductive pads by solder fillets comprising a low amount of tin available for wetting the pin shafts, e.g., no greater than about 20 wt % tin. In an embodiment of the present invention, solder fillets are prepared comprising no greater than about 10 wt % tin. Suitable solder compositions of the present invention can be formulated, for example, comprising about 85 wt % to about 82 wt % lead, about 12 wt % to about 8 wt % antimony, about 10 wt % to about 3 wt % tin and up to about 5 wt % silver. In another embodiment of the present invention, the alloys comprise about 80 wt % to about 50 wt % lead and about 50 wt % to about 20 wt % indium.

In accordance with the present invention, formulated solder alloys are formed as solder fillets on an organic substrate for interconnecting a conductive pad, such as a metallized pad, on the organic substrate to a pin lead. In an embodiment of the present invention, the solder fillet on the organic substrate has reflow temperature, i.e. the temperature which the solder is mobile enough to form an electrical connection, of no less than about 205° C., e.g. from about 240° C. to about 270° C. Hence, the pins can be mechanically and electrically joined to the pads by reflowing the solder fillet at a temperature of from about 250° C. to about 275° C. Table 1 below provides solder alloys together with their melting characteristics that are suitable for forming solder fillets on organic substrates in accordance with the present invention.

TABLE 1

| Alloy | Solidus | Liquidus (° C.) | |
|---|---|---|---|
| (wt %) | (° C.) | Major | Minor |
| 82 Pb/10 Sn/8 Sb | 244 | 245 | 257 |
| 83 Pb/10 Sb/5 Sn/2 Ag | 237 | 239 | 248 |
| 85 Pb/11.5 Sn/3.5 Sn | 240 | 245 | 248 |
| 85 Pb/10 Sb/5 Sn | 240 | 245 | 253 |
| 82 Pb/10 Sb/8 Sn | 244 | 245 | 257 |
| 81 Pb/19 In | 260 | 275 | — |
| 75 Pb/25 In | 240 | — | 260 |
| 50 Pb/50 In | 184 | — | 210 |

The solder fillets of the present invention further advantageously have a reflow temperature which is higher than the temperature of the solder pads yet lower than the decomposition temperature of the organic substrate. In an embodiment of the present invention, the organic substrate comprises a high temperature stable polymeric material, such as sulphone, polyarysulphone, phenol, polyamide, bismaleimide-triazine, epoxy or mixtures thereof. Polyimides are radiation resistant high temperature stable materials that can be prepared as laminates for organic packages. For example, polyimide itself has a decomposition temperature of over about 300° C. Polyimides can further be copolymerized with one or more imide substituted monomers to enhance dielectric and/or thermal properties. Typical monomers that can be copolymerized with polyimides include amides, phenolics, bismaleimide, epoxys and esters to form the corresponding polyimide copolymers.

The organic substrate of the present invention can be fabricated in the form of a molded part or as a laminated structure. A laminated structure with internal wiring connecting the solder pads with the leads at the bottom of the structure can be fabricated having one or more conductive layers and insulating polymer layers with optionally fiberous materials, such as glass fibers. For example, the organic substrate can be fabricated from an organic epoxy-glass resin based material, such as bismaleimide-triazine (BT) resin or FR-4 board laminate having a high decomposition temperature.

In an embodiment of the present invention, the organic substrate comprises a bismaleimide-triazine epoxy laminate structure having a plurality of solder pads thereon for receiving a particular device. The laminate further includes a plurality of metallized pads in electrical communication with the solder pads and a plurality of pins mechanically joined to the metallized pads by a solder fillet of the present invention. In an embodiment of the present invention, the solder fillets on the laminate comprise no more than about 20 wt % tin and has a reflow temperature of no greater than about 275° C.

In practicing the invention, a device assembly can be prepared by aligning a device having a plurality of solderable contacts thereon with the conductive contacts, e.g. solder pads, on the organic substrate of the present invention. The device can be any device having a solderable conductive contact thereon. For example, the device can be a high lead solder bumped IC, e.g. 97–95 wt % Pb/3–5 wt % Sn, or a bumped capacitor, or any other device having a solderable conductive contact. Between the high lead solder bump and the device can be under bump metallurgy, i.e. one or more layers or an alloy of chrome, copper, gold, titanium, nickel, etc.

Once the carrier member of the present invention is aligned with the device, an electrical interconnection is formed between the device and the member by the application of heat, such as by infrared radiation, a flow of dry heated gas, such as in a belt furnace, or a combination thereof, to reflow the solder pads on the member and interconnect the device and carrier member. In an embodiment of the present invention, the solder pads on the carrier member are reflowed by a process of heating the organic carrier member from about 230° C. to about 270° C., e.g. heating the carrier member to about 250° C., by a process of a combined infrared/convection heater.

In accordance with the present invention, the solder fillet joining the pin leads to conductive pads on the carrier member has a reflow temperature higher than the temperature necessary to attach the semiconductor device, e.g. a temperature difference of no less than approximately 10° C. In an embodiment of the present invention, the temperature difference between reflowing the solder pads and the solder alloy joining the pins is no less than approximately 5° C.

The process steps and structures described above do not form a complete process flow for manufacturing device assemblies or the packaging of integrated semiconductor devices. The present invention can be practiced in conjunction with electronic package fabrication techniques currently used in the art, and only so much of the commonly practiced process steps are included as are necessary for an understanding of the present invention. The figures representing cross-sections of portions of electronic package fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A carrier member for mounting a device, the member comprising:

an organic substrate having a plurality of conductive contacts thereon for receiving a device to be mounted thereto;

a plurality of pads on the organic substrate which are in electrical communication with the conductive contacts on the organic substrate; and a plurality of pins mechanically and electrically joined to the pads by a solder fillet, wherein the solder fillet has no more than about 60 wt % tin and has a reflow temperature of no greater than about the decomposition temperature of the organic substrate.

2. The carrier member of claim 1, wherein the solder fillet comprises no more than about 20 wt % tin.

3. The carrier member of claim 1, wherein the solder fillet comprises no more than about 10 wt % tin.

4. The carrier member of claim 1, wherein the solder fillet comprises about 85 wt % to about 82 wt % lead, about 12 wt % to about 8 wt % antimony, about 10 wt % to about 3 wt % tin and up to about 5 wt % silver.

5. The carrier member of claim 1, wherein the solder fillet comprises about 80 wt % to about 50 wt % lead and about 50 wt % to about 20 wt % indium.

6. The carrier member of claim 1, wherein the conductive contacts comprise solder pads and the solder fillet joining the pads to the pins has a reflow temperature higher than the reflow temperature of the solder pads.

7. The carrier member of claim 6, wherein the temperature difference between reflowing the solder pads and the solder fillet is no less than approximately 10° C.

8. The carrier member of claim 6, wherein the solder pads comprise eutectic solder.

9. The carrier member of claim 1, wherein the solder fillet has a reflow temperature of no greater than about 300° C.

10. The carrier member of claim 1, wherein the organic substrate comprises a laminated structure.

11. The carrier member of claim 1, wherein the organic substrate comprises polyphenylene sulphide, polysulphone, polyethersulphone, polyarysulphone, phenol, polyamide, bismaleimide-triazine, epoxy or mixtures thereof.

12. The carrier member of claim 1, wherein the organic substrate comprises a bismaleimide-triazine epoxy laminate.

13. The carrier member of claim 1, wherein the organic substrate comprises a molded plastic.

14. A carrier member for mounting a device, the member comprising:

a substrate comprising a bismaleimide-triazine epoxy laminate having a plurality of solder pads thereon for receiving a device to be mounted thereto;

a plurality of metallized pads on the substrate which are in electrical communication with the solder pads on the substrate; and a plurality of pins mechanically and electrically joined to the metallized pads by a solder fillet, wherein the solder fillet has a reflow temperature higher than the reflow temperature of the solder pads.

15. A device assembly, the assembly comprising:

the carrier member of claim 1; and a device having a plurality of solderable contacts thereon, wherein the solderable contacts of the device are in electrical communication with the carrier member through the conductive contacts on the organic substrate.

16. The device assembly of claim 15, wherein the solderable contacts comprise an alloy or layers of chrome, copper and gold in electrical communication with solder bumps.

17. The device assembly of claim 16, wherein the device is an integrated circuit die.

* * * * *